United States Patent
Melanson

(10) Patent No.: US 7,221,303 B1
(45) Date of Patent: May 22, 2007

(54) DELTA SIGMA MODULATOR ANALOG-TO-DIGITAL CONVERTERS WITH MULTIPLE THRESHOLD COMPARISONS DURING A DELTA SIGMA MODULATOR OUTPUT CYCLE

(75) Inventor: John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 11/388,425

(22) Filed: Mar. 24, 2006

(51) Int. Cl.
*H03M 3/00* (2006.01)

(52) U.S. Cl. .................... 341/143; 341/155
(58) Field of Classification Search ............ 341/143, 341/155, 144, 163
See application file for complete search history.

(56) References Cited

U.S. PATENT DOCUMENTS

| | | | |
|---|---|---|---|
| 5,870,052 A * | 2/1999 | Dedic et al. ............. | 341/161 |
| 6,215,427 B1 * | 4/2001 | Bonhoure et al. ........ | 341/118 |
| 6,380,881 B2 * | 4/2002 | Harada et al. ........... | 341/165 |
| 6,717,542 B2 * | 4/2004 | Harada .................... | 341/161 |
| 6,809,674 B1 * | 10/2004 | Ramsden ................. | 341/155 |
| 6,919,837 B2 * | 7/2005 | Harada et al. ........... | 341/163 |
| 2006/0077090 A1 | 4/2006 | Schimper ................. | 341/155 |

* cited by examiner

*Primary Examiner*—Peguy JeanPierre
(74) *Attorney, Agent, or Firm*—Hamilton & Terrile, LLP; Kent B. Chambers

(57) ABSTRACT

The analog-to-digital (ADC) delta sigma modulators in the signal processing systems described utilize comparator number reduction techniques to improve a delta sigma modulator quantizer. The delta sigma modulator generates one quantization output signal per delta sigma modulator output cycle. A quantizer of the delta sigma modulator includes one or more comparators, that each makes at least two comparisons per delta sigma modulator output cycle. The one or more comparators compare a quantizer input signal against one or more thresholds. A successive reference generator determines the one or more thresholds for the one or more comparators wherein each of the one or more thresholds during a later one of the at least two comparisons is in conformity with results of an earlier one of the at least two comparisons. Redundant and other iterative comparison techniques and threshold generation techniques are used to efficiently reduce the number of comparators in the quantizer while maintaining accuracy.

28 Claims, 5 Drawing Sheets

DELTA SIGMA MODULATOR ANALOG-TO-DIGITAL CONVERTERS WITH MULTIPLE THRESHOLD COMPARISONS DURING A DELTA SIGMA MODULATOR OUTPUT CYCLE

CROSS-REFERENCED PATENT APPLICATIONS

This patent application cross-references U.S. application Ser. No. 11/388,397 entitled "Delta Sigma Modulators with Comparator Offset Noise Conversion" by inventor John Melanson filed on Mar. 24, 2006 and U.S. application Ser. No. 11/388,436 entitled "Delta Sigma Modulator Analog-to-Digital Converters with Multiple Threshold Comparisons during a Delta Sigma Modulator Output Cycle" by inventor John Melanson filed on Mar. 24, 2006.

BACKGROUND OF THE INVENTION

1. Field of the Invention

The present invention relates in general to the field of information processing, and more specifically to a signal processing system and method for reducing a number of comparators in a quantizer by using multiple threshold comparisons during an analog-to-digital delta sigma modulator output cycle with a final threshold based on a threshold determined earlier in the same delta sigma modulator output cycle.

2. Description of the Related Art

Many signal processing systems include delta sigma modulators to quantize an input signal into one or more bits. Delta sigma modulators trade-off increased noise in the form of quantization error in exchange for high sample rates and noise shaping. "Delta-sigma modulators" are also commonly referred to using other interchangeable terms such as "sigma-delta modulators", "delta-sigma converters", "sigma delta converters", and "noise shapers".

FIG. 1 depicts an analog-to-digital converter (ADC) delta sigma modulator 100 that receives an analog input signal x(t) and converts the input signal x(t) into a series of low resolution, digital output pulses q(n), where t represents a continuous time variable and n denotes a discrete time variable. In general, the delta sigma modulator 100 quantizes a difference between the current input signal x(t) and an analog version of the previous quantizer output signal, i.e. q(t−1). In the feedback loop of delta sigma modulator 100, a digital-to-analog converter (DAC) 108 converts each delayed ($z^{-1}$) output signal q(n−1) into an analog signal q(t−1). The feedback loop of delta sigma modulator 100 also includes dynamic element matching 106 to correct nonlinearities in the DAC 108 signal q(n−1).

The noise shaping loop filter 102 processes a difference between input signal x(t) and the delayed output signal q(t−1) to generate a loop filter output signal/quantizer input signal $V_{LF}$. During each output cycle of delta sigma modulator operation, quantizer 104 quantizes signal $V_{LF}$ to generate output signal q(n), generally in the form of digital data. When loop filter 102 is a continuous time filter, the quantizer 104 represents a relatively low-accuracy ADC converter operating at an oversampling rate, such as a rate of 64:1. Quantizer 104 can provide multi-bit or one-bit output quantization levels. The quantization level step size, $\Delta$, represents the difference between each quantization level. One-bit quantizers have only two quantization levels specified as $\{-\Delta/2, -\Delta/2\}$ or $\{-1,1\}$. Shreier and Temes, *Understanding Delta-Sigma Signal Converters*, IEEE Press, 2005 (referred to herein as "Shreier & Temes") describes conventional delta-sigma modulators in more detail.

Multi-bit ADC delta sigma modulators exhibit some well-known advantages over single bit ADC delta sigma modulators such as reduced quantization noise. However, quantizer design continues to represent one of the significant challenges confronting delta sigma modulator designers.

FIG. 2 depicts a flash-type quantizer 200, which represents one embodiment of quantizer 104. Quantizer 200 includes r comparators 202.0–202.r−1, each having a first input connected to the output of loop filter 102 to receive quantizer input signal $V_{LF}$. "r" is a positive integer representing the number of comparators in delta sigma modulator 100. Each of the comparators 202.0–202.r−1 includes a second input to receive respective reference voltages $V_0$ through $V_{r-1}$. The reference voltages serve as reference signals to quantize the quantizer input signal $V_{LF}$. A resistor string reference ladder of r−1 resistors 204.1–204.r−1 of value R generates uniform voltage drops across at least reference resistors 204.1–204.r−1 to generate respective reference voltages $V_0$ through $V_{r-1}$. The end resistors 204.0 and 204.r have values that can be used to scale the quantization levels (also referred to as a "quantizer step"). For example, the largest quantizer threshold may be 1.2 V, but the available reference may be 2.5 V, so resistors 204.0 and 204.r are set to achieve the desired scale. A reference voltage of +Vref to −Vref is applied across the reference resistors 204.0–204.r. +/−Vref is, for example, +/−1.5 Volts (V).

Each of comparators 202.0–202.r−1 compares the quantizer input signal $V_{LF}$ with respective reference voltages $V_0$ through $V_{r-1}$. The $i^{th}$ comparator 202.i generates a logical zero (e.g. 0 V) when the $i^{th}$ reference voltage $V_i$ is less than or equal to the loop filter output/quantizer input signal $V_{LF}$ and a logical one (e.g. +2.5 V) when $V_i > V_{LF}$. Once during each cycle of quantizer 104 operation, digital encoder 206 encodes the output signals of comparators 202.0–202.r−1 into a digital (discrete) output signal q(n).

Increasing the number of comparators in quantizer 104, i.e. increasing the value of r, yields a higher quality output signal q(n) (e.g. less quantization noise) and higher signal bandwidth capabilities. Each time r doubles, delta sigma modulator 100 typically achieves a 6 dB quantization noise improvement. However, disadvantages also accompany increasing the number of comparators in quantizer 104. For example, increasing the number of comparators requires more physical area to implement and more power to operate. Additionally, increasing the number of comparators decreases voltage spacing between adjacent reference voltages $V_i$ and $V_{i+1}$ and increases the relative effects of non-idealities, such as comparator offset voltages.

Comparator offset voltages represent the minimum direct current (DC) input voltage that would have to be applied to input terminals of the comparator to cause the comparator to transition state. Thus, comparator offset voltages can cause error in the comparator outputs, especially when the difference between the reference input signals of adjacent comparators is small. Accordingly, as the relative effects of quantizer non-idealities increase, the nonidealities cause increasing delta sigma modulator error. The non-linearity can cause harmonic distortion, especially at high signal frequencies, increased noise, and modulation of noise with the direct current (DC) input level, all of which are undesirable.

An example with the number of comparators equal to r=16 illustrates effects of comparator nonidealities. Assuming seventeen (17) quantization levels, normalized to −8, −7, −6, . . . , −1, 0, +1, +2, . . . , +8, the input reference voltages $V_0$ through $V_{15}$ to respective comparators 202.0–202.r–1 are normalized values of −7.5, −6.5, −5.5, . . . , −0.5, +0.5, . . . , +5.5, +6.5, +7.5. Each actual reference voltage $V_i$ scales with the analog system reference voltage $V_{ref}$. For example, if level −8 corresponds to −1.5 V and level +8 corresponds to +1.5 V, then the respective comparator input voltage references $V_0$ through $V_{15}$ for comparators 202.0–202.r–1 are −7.5/8*1.5, −6.5/8*1.5, . . . , +6.5/8*1.5, and +7.5/8*1.5V. Thus, as the number of comparators increases the voltage reference spacing decreases. It follows that as the number of comparators increases, eventually non-linearities of the flash-type quantizer 200 counteract any advantage obtained by increasing the number of comparators. Additionally, in an integrated circuit, chip area is valuable. Increasing the number of comparators requires more chip area and, thus, can become a dominant disadvantage.

FIG. 3 depicts a tracking ADC quantizer 300, which represents another embodiment of quantizer 104. The tracking ADC quantizer 300 is described in detail in Dorrer et al., *A 3-mW 74-dB SNR 2-MHz Continuous-Time Delta-Sigma ADC With a Tracking ADC Quantizer in 0.13-μm CMOS*, IEEE Journal of Solid-State Circuits, Vol. 40, No. 12, December 2005. The quantizer 300 reduces the number of comparators to three comparators 302.0, 302.1, and 302.2, a counter 304, an R-string reference ladder 306, and a switching matrix 308 to connect the reference voltages $V_0$, $V_1$, and $V_2$ to the inputs of comparators 302.0, 302.1, and 302.2. When the loop filter 102 output voltage $V_{LF}$ has a value of 1 least significant bit (LSB) or less, only the middle comparator 302.1 will change state, and the state of counter 304 remains unchanged. For $V_{LF}$ signal changes larger than 1 LSB, adjacent comparators 302.2 or 302.0 will change state depending upon whether the change is greater than or less than the previous state. The logic 310 detects this state change and increases the output of counter 304 or decreases the output of counter 304 depending upon whether comparator 302.2 or 302.0 changed state. By changing the state of counter 304, the reference voltages $V_0$, $V_1$, and $V_2$ to respective comparators 302.0, 302.1, and 302.2 are tracked to the new output value of counter 304. In each cycle of operation of delta sigma modulator 300, the output signal q(n) of quantizer 300 is generated by using the result of counter 304 and the output signal of comparators 302.0, 302.1, and 302.2.

Despite developments in quantizer technology, ADC delta sigma modulator quantizer design can still be improved to reduce the number of comparators used in comparable ADC delta sigma modulator quantizer designs and the effects of comparator non-idealities.

SUMMARY OF THE INVENTION

In one embodiment of the invention, a signal processing system includes an analog-to-digital delta sigma modulator, wherein the delta sigma modulator generates one quantization output signal per delta sigma modulator output cycle. The delta sigma modulator includes a loop filter to generate a quantizer input signal and a quantizer coupled to the loop filter. The quantizer includes an input terminal to receive the quantizer input signal and one or more comparators. The one or more comparators each makes at least two comparisons per delta sigma modulator output cycle and each is configured to receive the quantizer input signal and compare the quantizer input signal against one or more thresholds. The quantizer also includes a successive reference generator, coupled to the one or more comparators, to determine the one or more thresholds. Each of the one or more thresholds during a later one of the at least two comparisons is in conformity with results of an earlier one of the at least two comparisons.

In another embodiment of the present invention, a method of processing a quantizer input signal with a delta sigma modulator, wherein the delta sigma modulator generates one quantization output signal per delta sigma modulator output cycle, includes noise shaping an input signal to generate the quantizer input signal. The method further includes receiving the quantizer input signal with an input terminal of one or more comparators and, comparing, by the one or more comparators that each makes at least two comparisons per delta sigma modulator output cycle, the quantizer input signal against one or more thresholds. The method also includes determining, by a successive reference generator, the one or more thresholds for the one or more comparators. Each of the one or more thresholds during a later one of the at least two comparisons is in conformity with results of an earlier one of the at least two comparisons.

In a further embodiment of the present invention, a signal processing system includes an analog-to-digital delta sigma modulator. The delta sigma modulator includes an input to receive an input signal, a filter coupled to the input, and a quantizer. The quantizer is coupled to the filter to quantize an output of the filter in an output cycle of operation of the delta sigma modulator. The quantizer includes one or more comparators. The one or more comparators each makes at least two comparisons per output cycle and each is configured (i) to receive the input signal, and (ii) to compare the input signal against one or more thresholds. The quantizer further includes a successive reference generator, coupled to the one or more comparators, to determine the one or more thresholds for the one or more comparators, wherein each of the one or more thresholds during a later one of the at least two comparisons is in conformity with results of an earlier one of the at least two comparisons.

In another embodiment of the present invention, a method of quantizing an input signal with an analog-to-digital delta sigma modulator includes noise shaping the input signal to generate a quantizer input signal. The method further includes receiving the quantizer input signal during a delta sigma modulator output cycle and receiving successive reference signals during the delta sigma modulator output cycle. The method also includes iteratively comparing the quantizer input signal with the successive reference signals during the delta sigma modulator output cycle. The method further includes generating one output for the delta sigma modulator output cycle. The one output represents an estimate of the quantizer input signal derived from the iterative comparisons between the quantizer input signal and the successive reference signals.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Figure 1:
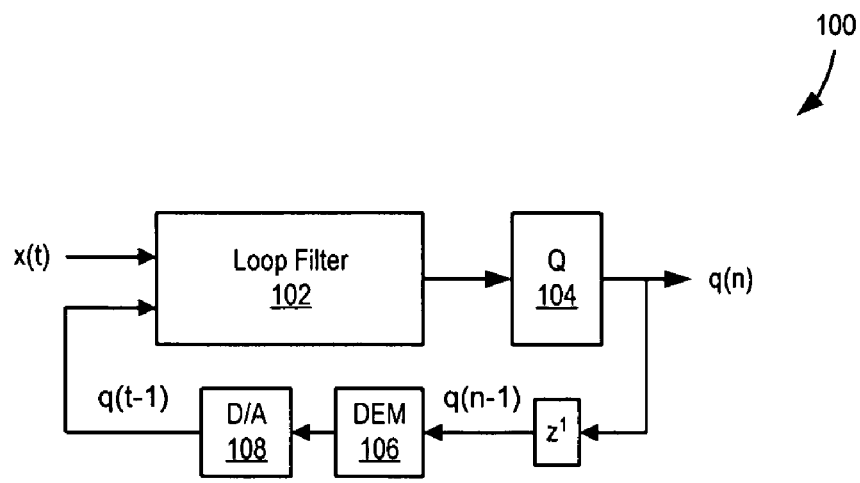
FIG. 1 (labeled prior art) depicts an analog-to-digital converter (ADC) delta sigma modulator.
Figure 2:
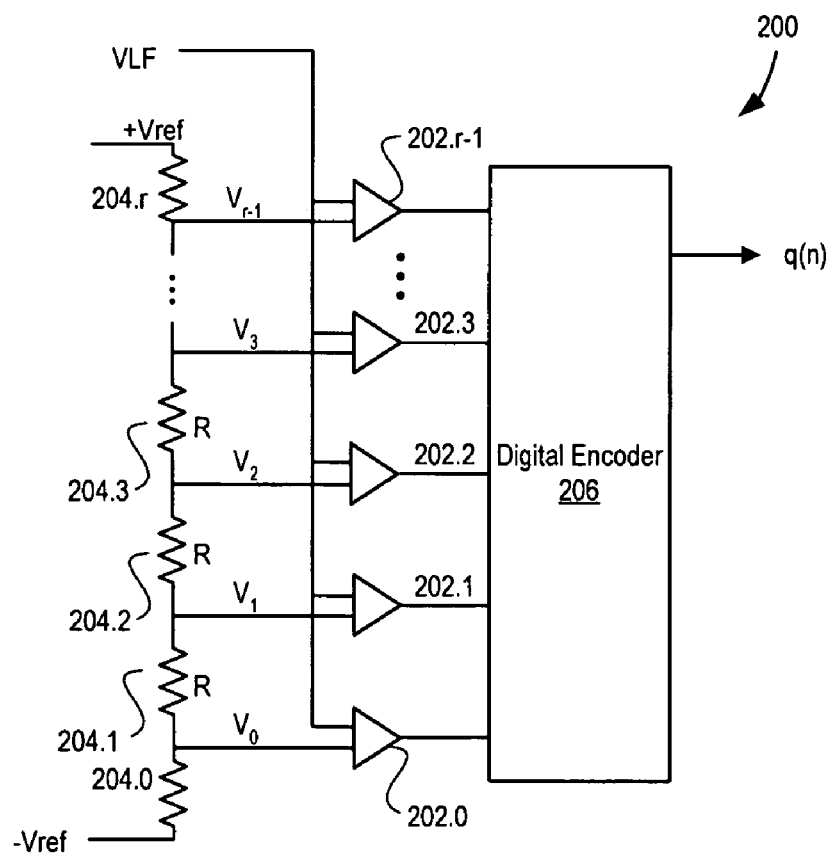
FIG. 2 (labeled prior art) depicts a flash-type quantizer of a delta sigma modulator.
Figure 3:
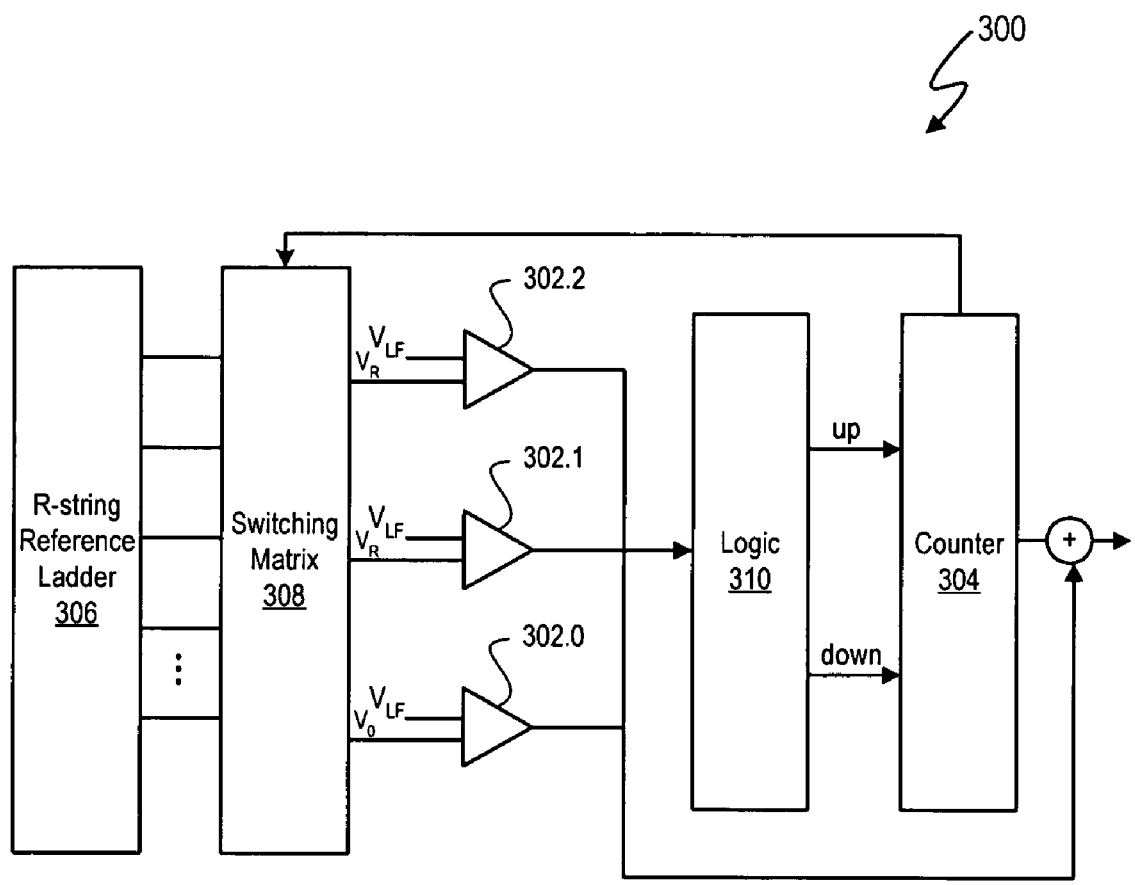
FIG. 3 (labeled prior art) depicts a tracking ADC quantizer.
Figure 4:
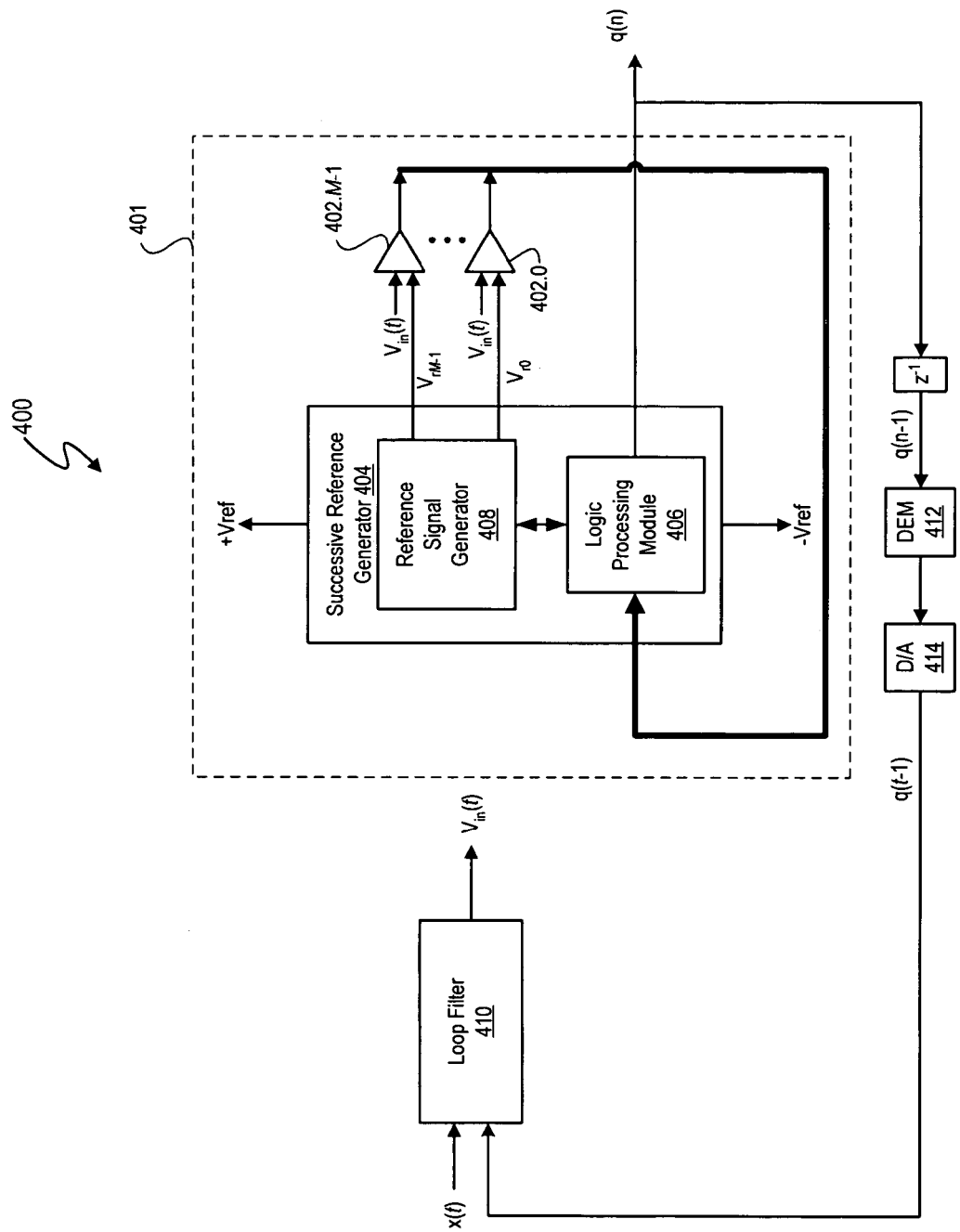
FIG. 4 depicts a delta sigma modulator that includes a quantizer that utilizes multiple approximation cycles and successive, dependent thresholds to quantize an output signal.

The analog-to-digital (ADC) delta sigma modulators in the signal processing systems described utilize comparator number reduction techniques to improve a delta sigma modulator quantizer. The delta sigma modulator generates one quantization output signal per delta sigma modulator output cycle. A quantizer of the delta sigma modulator includes one or more comparators to compare a quantizer input signal against multiple thresholds during a single delta sigma modulator output cycle. A delta sigma modulator with N threshold voltages has N+1 possible feedback levels. Normally, one comparison would be accomplished per delta sigma output cycle. The thresholds would be set to e.g. {−1.5 −0.5 0.5 1.5} in a 4 comparator, 5 level modulator, where the thresholds are scaled to the quantization step. By making more than one comparison per output cycle, the invention reduces the number of comparators to M, where M<N, and M may be as small as one (1). An N-level successive reference generator determines multiple respective thresholds for each of the comparators. The successive reference generator determines a final threshold using one or more thresholds determined earlier in the same delta sigma modulator output cycle, wherein N is an integer. The results of earlier comparisons determine the thresholds to be used by later comparisons, in a way similar to successive approximation converters. Redundant and other iterative comparison techniques and threshold generation techniques are used to efficiently reduce the number of comparators in the quantizer while maintaining accuracy. Although the final quantizer decision is based on the above "half step" levels, it is advantageous in some embodiments to use even step levels in the earlier decision. Referring to FIG. 4, delta sigma modulator 400 includes a quantizer 401 that utilizes multiple approximation cycles and successive, dependent thresholds to quantize an output signal of loop filter 410. In one embodiment, loop filter 410 is a $j^{th}$ order analog filter, where j represents the order of loop filter 410 and is an integer greater than one (1). The quantizer output signal $q(n)z^{-1}$ (i.e. q(n−1) is fed back through optional dynamic element matching elements (DEMs) 412 and digital-to-analog converter (DAC) 414 to generate a feedback loop filter input signal q(t−1). Loop filter 410 provides noise shaping to a difference between delta sigma modulator input signal x(t) and q(t−1). Loop filter 410 generates a loop filter output signal, which in at least one embodiment represents a quantizer input signal $V_{in}(t)$. Embodiments of loop filter 404, DEMs 406, and DAC 408 are described in more detail in Shreier & Temes.

Quantizer 401 includes a successive reference generator 404 to determine the values of reference signals $V_{r0}$ through $V_{rM-1}$, generate reference signals $V_{r0}$ through $V_{rM-1}$, and generate quantizer output signal q(n), where "M" is . During one delta sigma modulator output cycle, the successive reference generator 404 iteratively generates multiple thresholds to compare against the quantizer input signal $V_{in}(t)$. During the delta sigma modulator output cycle, next thresholds are generated based on past threshold values and the outcome of comparisons against the past threshold values. Thus, the successive reference generator 404 updates the threshold values based on past comparisons to iteratively determine a quantizer output signal q(n). In at least one embodiment, the successive reference generator 404 utilizes a multiplexer to select the different threshold values during each approximation cycle. Additionally, successive reference generator 404 can progress from comparisons with coarse threshold values to finer threshold values during the course of a delta sigma modulator output cycle. Coarse to fine threshold adjustments allow successive reference generator 404 to more quickly determine the value of quantizer input signal $V_{in}(t)$ and allow for fluctuations in quantizer input signal $V_{in}(t)$ during a delta sigma modulator output cycle.

Each of the reference signals $V_{r0}$ through $V_{rM-1}$ has a value that represents a respective threshold $TH_0$ through $TH_{M-1}$ against which comparators 402.0 through 402.M−1 compare the quantizer input signal $V_{in}(t)$. Each of comparators 402.0 through 402.M−1 includes an input terminal to receive the quantizer input voltage $V_{in}$. The quantizer input voltage $V_{in}$ is generally the direct output of a loop filter, such as loop filter 410, and is the signal to be quantized by quantizer 401. The comparators 402.0 through 402.M−1 also each include an input terminal to receive one of the respective reference signals $V_{r0}$, $V_{r1}$, . . . , $V_{rM-1}$ from successive reference generator 404 during each approximation cycle.

The quantizer 401, and, thus, delta sigma modulator 400, generates one quantizer output signal q(n) per each delta sigma modulator output cycle. Quantizer 401 performs multiple approximation cycles during each delta sigma modulator output cycle. During each approximation cycle, the comparators 402.0 through 402.M−1 compare the quantizer input signal $V_{in}(t)$ with the respective threshold $TH_0$ through $TH_{M-1}$, which is representative of the values of the respective reference signals $V_{r0}$ through $V_{rM-1}$. Upon each comparison, each of comparators 402.0 through 402.M−1 provides a comparator output signal $V_{c0}, V_{c1}, \ldots, V_{cM-1}$ that represents the outcome of the comparison. In at least one embodiment, the comparator output signal $V_{ci}$ of the $i^{th}$ comparator 402.i is a logical one (1) if the quantizer input signal $V_{in}(t)$ is greater than the threshold $TH_i$, and is a logical zero (0) if the quantizer input signal $V_{in}(t)$ is less than or equal to threshold $TH_i$, where i ∈ {0, 1, . . . , M−1}.

Successive reference generator 404 also includes a logic processing module 406 to receive the comparator output signals $V_{c0}, V_{c1}, \ldots, V_{cM-1}$ of each of comparators 402.0 through 402.M−1. The logic processing module 406 determines the values of the reference signals $V_{r0}$ through $V_{rM-1}$. Based on the values of each of reference signals $V_{r0}$ through $V_{rM-1}$ for the current approximation cycle and the comparator output signals $V_{c0}, V_{c1}, \ldots, V_{cM-1}$ for the current approximation cycle, logic processing module 406 determines an estimation of the current value of the quantization input signal $V_{in}$. The logic processing module 406 also determines the values of reference signals $V_{r0}$ through $V_{rM-1}$ to be generated by reference signal generator 408 in the next approximation cycle. The generation and determination of each set of reference signals $V_{r0}$ through $V_{rM-1}$ is discussed in more detail below.

The quantizer 401 provides a quantization output q(n) once during each output cycle n, where n represents the current output cycle. At the end of each output cycle, the logic processing module 406 determines an estimated value of the input signal $V_{in}$ from the values of the comparator output signals $V_{c0}$, $V_{c1}$, ..., $V_{cM-1}$. The logic processing module 406 provides a digital quantization output signal q(n) that represents the estimated value of quantizer input signal $V_{in}(t)$ for the $n^{th}$ delta sigma modulator output cycle. The iterative determination by quantizer 401 of the quantizer input signal $V_{in}(t)$ by the logic processing module 406 is discussed in more detail below.

Figure 5:
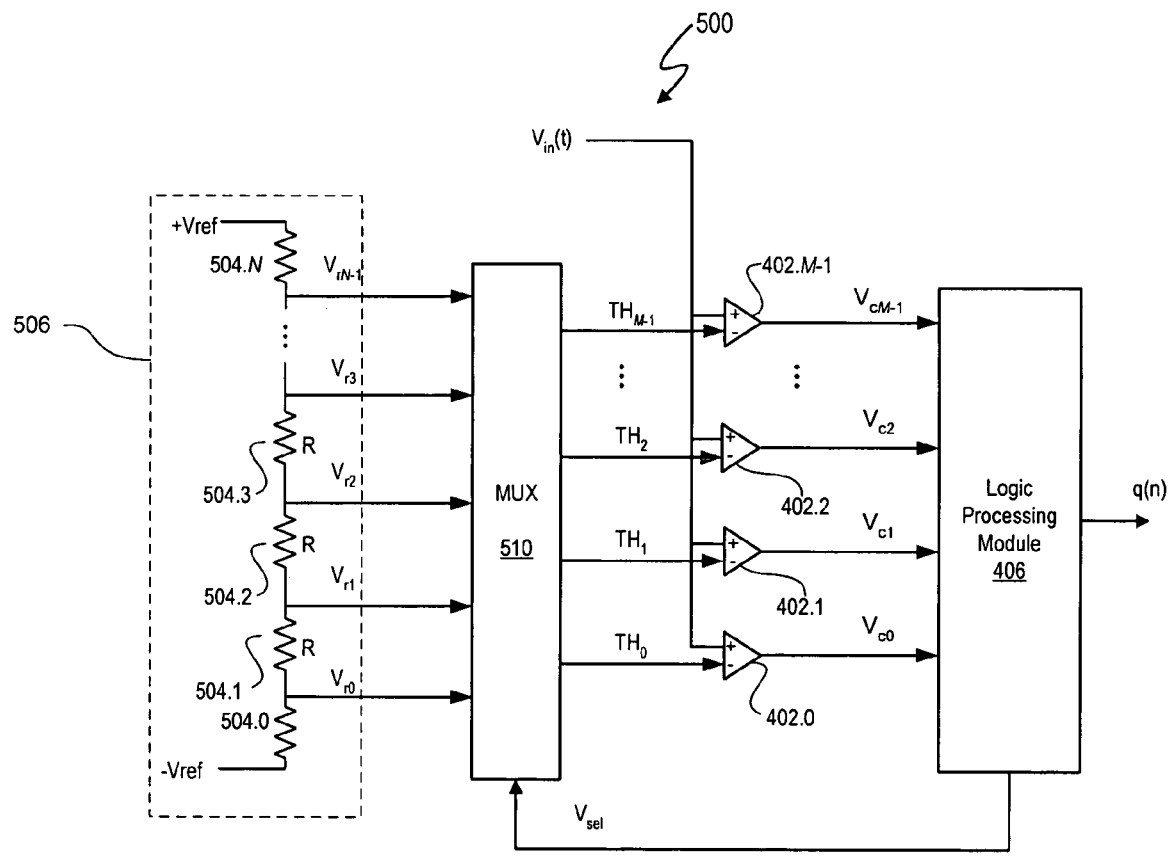
FIG. 5 depicts a successive reference generator.

FIG. 5 depicts a successive reference generator 500, which represents one embodiment of successive reference generator 404. During each approximation cycle, the multiplexer 510 receives a selection signal $V_{sel}$ from logic processing module 406, and the multiplexer 510 selects reference signals to apply to comparators 402.0 through 402.M−1. In at least one embodiment, reference signal generator 506 includes a resistor string reference ladder 506 of N+1 resistors 504.0 through 504.N in series. Thus, reference signal generator 506 is able to generate N distinct quantization levels. In at least one embodiment, each of reference resistors 504.1 through 504.N−1 has a resistance of R. The value of R is a matter of design choice and depends upon, for example, the value of reference voltage Vref and desired quantization levels of reduced comparator quantizer 402. The value of end resistors 504.0 and 504.N are selected for proper scaling of the reference signals $V_{r0}$, $V_{r1}$, ..., $V_{rM-1}$ to achieve the desired quantization levels. Resistors 504.0 through 504.N are preferably designed to have differential non-linearity and integral non-linearity characteristics that are acceptable for the intended use of the quantizer 401. In other embodiments, reference signal generator 506 uses other types of impedances, such as capacitors, to generate the selected reference signals $V_{r0}$–$V_{rM-1}$.

Successive reference generator 500 also includes a multiplexer 510 that receives the selection signal $V_{sel}$ from logic processing module 406. As described in more detail below, the multiplexer 510 selects the reference signals corresponding to thresholds indicated by selection signal $V_{sel}$. The multiplexer can be any N input by M output multiplexer or, for example, can be subdivided into multiple multiplexers.

Quantizer 401 uses multiple approximation cycles during each delta sigma modulator output cycle to quantize the input signal $V_{in}$. Subsequent threshold values used to compare against quantizer input signal $V_{in}(t)$ are based on previous threshold values during the same delta sigma modulator output cycle. A final approximation cycle for the delta sigma modulator output cycle generates a final threshold value for each comparator 402.0 through 402.M−1 from which logic processing module 406 determines the value of quantizer output signal q(n).

Loop filter 410 is generally a switched capacitor filter or a continuous time analog filter. In a switched capacitor embodiment, in at least one embodiment the multiple approximation cycles begin when loop filter 410 has generally settled to a final value of quantizer input signal $V_{in}(t)$ during a delta sigma modulator output cycle. In the switched capacitor embodiment, loop filter 410 generally settles to a final value of quantizer input signal $V_{in}(t)$ within one-half (½) of a delta sigma modulator output cycle. In a continuous time embodiment, the output of loop filter 410, $V_{in}(t)$, changes relatively linearly with time. The amount of change during a single delta sigma modulator output cycle is generally limited and can be determined by simulating responses to a full range of representative input signals x(t). In some embodiments below, the quantizer tracks quantizer input signal $V_{in}(t)$. The amount tracking directly corresponds to the amount of change in quantizer input signal $V_{in}(t)$ during a single delta sigma modulator output cycle. In at least one embodiment, the number of approximation cycles used to track quantizer input signal $V_{in}(t)$ is constant for all delta sigma modulator output cycles.

It has been determined that embodiments of using multiple approximation cycles during a single delta sigma modulator output cycle can offer several benefits. In actual operation, the loop filter 410 requires a finite amount of time to cease any substantial drift and settle to a steady state value. Quantizing quantizer input signal $V_{in}(t)$ from an unsettled loop filter 410 can induce error, especially if quantizer input signal $V_{in}(t)$ changes reflect a significant percentage of a quantization level (step size). An unsettled value of quantizer input signal $V_{in}(t)$ is especially troublesome if the loop filter 410 is a continuous time filter, where the value of quantizer input signal $V_{in}(t)$ can change constantly. Multiple approximation cycles allow successive monitoring of the value of quantizer input signal $V_{in}(t)$ and, thus, can track changes in quantizer input signal $V_{in}(t)$. Additionally, multiple approximation cycles allow the quantizer to use a reduced number of comparators, i.e. less comparators than quantization levels. Reducing the number of comparators reduces the nonidealities that accompany increasing number of comparators.

The following tables illustrate exemplary iterative quantizer output signal determination processes that utilize multiple approximation cycles during a single delta sigma modulator output cycle to generate a quantizer output signal q(n). Furthermore, the following tables illustrate the use of multiple thresholds to determine the quantizer output signal wherein at least a final threshold of each delta sigma modulator output cycle is determined by a threshold determined earlier in the same delta sigma modulator output cycle. In at least one embodiment, non-final thresholds during a delta sigma modulator output cycle do not include the final threshold. Threshold levels normalized to the quantizer step size are used in the tables.

Table 1 illustrates an iterative quantizer output signal determination process using one comparator 402.0 during one delta sigma modulator output cycle. Each approximation cycle represents one comparison process by comparator 402.0. The initial conversions are offset by −0.5. The initial value of quantizer input signal $V_{in}(t)$ at the beginning of the delta sigma modulator output cycle equals 0.1 and the final value is −0.4. Simulations can be used to determine the largest possible quantizer input signal $V_{in}(t)$ change during a single delta sigma modulator output cycle. In this example, +/−0.5 is the largest change possible for quantizer input signal $V_{in}(t)$ in this example.

TABLE 1

| Approximation Cycle | Threshold Value - $TH_0$ | Quantizer input signal $V_{in}(t)$ | Comparison Outcome |
|---|---|---|---|
| 1 | 0 | +0.1 | Above |
| 2 | +4 | −0.1 | Below |
| 3 | +2 | −0.2 | Below |
| 4 | +1 | −0.3 | Below |
| 5 | +0.5 | −0.4 | Below |

The quantizer input signal $V_{in}(t)$ value changed from 0.1 to −0.4 during the delta sigma modulator output cycle. After approximation cycle 4, logic processing module 406 is able to determine that the value of quantizer input signal $V_{in}(t)$ must be either 0 or +1. The logic processing module 406 initially used a coarse threshold step of 0 to +4 in respective approximation cycles 1 and 2. The logic processing module 406 proceeded to use finer threshold steps to accurately determine the value of quantizer input signal $V_{in}(t)$. After approximation cycle 5, logic processing module 406 determines that the value of quantizer input signal $V_{in}(t)$ is closer to 0 than +1; therefore, the quantization output signal q(n) is set to 0. The iterative quantizer output signal determination process can use one or more redundant approximation cycles to ensure determination of an accurate estimate of quantizer input signal $V_{in}(t)$. In the embodiment of Table 1, approximation cycle 5 is a redundant approximation cycle that accurately determines that the best estimate of quantizer input signal $V_{in}(t)$ is q(n)=1.

Table 2 illustrates an iterative quantizer output signal determination process using one comparator 402.0 during one delta sigma modulator output cycle. Each approximation cycle represents one comparison process by comparator 402.0. The initial conversions are offset by −0.5. The initial value of quantizer input signal $V_{in}(t)$ at the beginning of the delta sigma modulator output cycle equals 0.1 and the final value is 0.6. Simulations can be used to determine the largest possible quantizer input signal $V_{in}(t)$ change during a single delta sigma modulator output cycle. In this example, +/−0.5 is the largest change possible for quantizer input signal $V_{in}(t)$ in this example.

TABLE 2

| Approximation Cycle | Threshold Value - $TH_0$ | Quantizer input signal $V_{in}(t)$ | Comparison Outcome |
|---|---|---|---|
| 1 | 0 | +0.1 | Above |
| 2 | +4 | +0.3 | Below |
| 3 | +2 | +0.4 | Below |
| 4 | +1 | +0.5 | Below |
| 5 | +0.5 | +0.6 | Above |

The quantizer input signal $V_{in}(t)$ value changed from 0.1 to 0.6 during the delta sigma modulator output cycle. After approximation cycle 4, logic processing module 406 is able to determine that the value of quantizer input signal $V_{in}(t)$ must be either 0 or +1. The logic processing module 406 initially used a coarse threshold step of 0 to +4 in respective approximation cycles 1 and 2. The logic processing module 406 proceeded to use finer threshold steps to accurately determine the value of quantizer input signal $V_{in}(t)$. After approximation cycle 5, logic processing module 406 determines that the value of quantizer input signal $V_{in}(t)$ is closer to +1 than 0, therefore, the quantization output signal q(n) is set to +1.

In a delta sigma modulator, the difference between successive quantizer values is usually limited. For example, in a 16 level system, and moderate oversampling ratios, the difference would typically be no more than +/−2 quantization steps (levels). For example, if q(n−1)=+4, q(n) will be a member of the set {+2, +3, +4, +5, +6}. Determination of the maximum quantizer level deviation of successive quantizer input signal $V_{in}(t)$ values can be determined by simulation as discussed in exemplary U.S. patent application Ser. No. 11/388,397, entitled "Delta Sigma Modulator Analog-To-Digital Converters With Quantizer Output Prediction And Comparator Reduction", inventor John L. Melanson, assignee Cirrus Logic, Inc., (Cirrus Logic Docket No. 1586-CA) and filed concurrently with the present application, which is hereby incorporated by reference in its entirety.

Thus, since the maximum quantizer level deviation of q(n−1) to q(n) can be determined, at least with a high degree of certainty, the current quantizer input signal $V_{in}(t)$ can be initially compared to a threshold value equal to q(n−1) and threshold values can be modified based on the previous comparison results. The final threshold value for the final comparison is, again, based on a previous threshold value used during the delta sigma modulator output cycle.

Table 3 illustrates an iterative quantizer output signal determination process for one delta sigma modulator output cycle using one comparator 402.0 with assumption that the maximum quantizer level deviation of q(n−1) to q(n) is +/−2 and q(n−1)=+4 and quantizer input signal $V_{in}(t)$ is 3.1.

TABLE 3

| Approximation Cycle | Threshold Value - $TH_0$ | Quantizer input signal $V_{in}(t)$ | Comparison Outcome |
|---|---|---|---|
| 1 | +4 | +3.1 | Below |
| 2 | +3 | +3.1 | Above |
| 3 | +3.5 | +3.1 | Below |

The successive approximations of the iterative quantizer output signal determination process illustrated in Table 3 demonstrates the shorter number of approximation cycles used to quantize quantizer input signal $V_{in}(t)$. Since fewer approximation cycles are needed to quantize quantizer input signal $V_{in}(t)$, the iterative quantizer output signal determination process can start later in the delta sigma modulator output cycle, when the loop filter 410 is more settled.

In the case of a continuous time loop filter 410, the logic processing module 406 operate in a tracking mode. The logic processing module 406 can use variations in the tracking step size, i.e. variations between successive threshold values, to accurately track quantizer input signal $V_{in}(t)$.

Table 4 illustrates an iterative quantizer output signal determination process using tracking for one comparator 402.0 during one delta sigma modulator output cycle. The initial quantizer input signal $V_{in}(t)$=4.1 and the final value is 3.4.

TABLE 4

| Approximation Cycle | Threshold Value - $TH_0$ | Quantizer input signal $V_{in}(t)$ | Comparison Outcome |
|---|---|---|---|
| 1 | +4 | +4.1 | Above |
| 2 | +5 | +3.9 | Below |
| 3 | +4 | +3.7 | Below |
| 4 | +3.5 | +3.4 | Below |

Thus, the logic processing module 406 is successfully able to track the variations of quantizer input signal $V_{in}(t)$ during the delta sigma modulator output cycle and determine a quantizer output signal q(n)=3.

Table 5 illustrates an iterative quantizer output signal determination process using tracking for one comparator 402.0 during one delta sigma modulator output cycle. The initial quantizer input signal $V_{in}(t)$=3.6 and the final value is 2.8.

TABLE 5

| Approximation Cycle | Threshold Value - $TH_0$ | Quantizer input signal $V_{in}(t)$ | Comparison Outcome |
|---|---|---|---|
| 1 | +4 | +3.6 | Below |
| 2 | +3 | +3.4 | Above |
| 3 | +4 | +3.2 | Below |
| 4 | +3.5 | +2.8 | Below |

Thus, the logic processing module 406 is successfully able to track the variations of quantizer input signal $V_{in}(t)$ during the delta sigma modulator output cycle and determine a quantizer output signal q(n)=3.

Table 6 illustrates an iterative quantizer output signal determination process using tracking for one comparator 402.0 during one delta sigma modulator output cycle. The initial quantizer input signal $V_{in}(t)$=3.6 and the final value is 4.3.

TABLE 6

| Approximation Cycle | Threshold Value - $TH_0$ | Quantizer input signal $V_{in}(t)$ | Comparison Outcome |
| --- | --- | --- | --- |
| 1 | +4 | +3.6 | Below |
| 2 | +3 | +3.8 | Above |
| 3 | +4 | +4.1 | Above |
| 4 | +4.5 | +4.3 | Below |

Thus, the logic processing module 406 is successfully able to track the variations of quantizer input signal $V_{in}(t)$ during the delta sigma modulator output cycle and determine a quantizer output signal q(n)=4.

Another embodiment of the iterative quantizer output signal determination using tracking for one comparator 402.0 is to alternate tracking threshold values at ½ quantization levels. This tracking process allows more movement of quantizer input signal $V_{in}(t)$ during the delta sigma modulator output cycle.

Table 7 illustrates an iterative quantizer output signal determination process using tracking for one comparator 402.0 using alternating tracking threshold values during one delta sigma modulator output cycle. The initial quantizer input signal $V_{in}(t)$=3.9 and the final value is 3.

TABLE 7

| Approximation Cycle | Threshold Value - $TH_0$ | Quantizer input signal $V_{in}(t)$ | Comparison Outcome |
| --- | --- | --- | --- |
| 1 | +4 | +3.9 | Below |
| 2 | +3.5 | +3.6 | Above |
| 3 | +4 | +3.3 | Below |
| 4 | +3.5 | +3.0 | Below |

Thus, the logic processing module 406 is successfully able to track the variations of quantizer input signal $V_{in}(t)$ during the delta sigma modulator output cycle and determine a quantizer output signal q(n)=3.

Table 8 illustrates an iterative quantizer output signal determination process using tracking for one comparator 402.0 using alternating tracking threshold values. The initial quantizer input signal $V_{in}(t)$=3.6 and the final value is 2.4.

TABLE 8

| Approximation Cycle | Threshold Value - $TH_0$ | Quantizer input signal $V_{in}(t)$ | Comparison Outcome |
| --- | --- | --- | --- |
| 1 | +4 | +3.6 | Below |
| 2 | +3.5 | +3.2 | Below |

TABLE 8-continued

| Approximation Cycle | Threshold Value - $TH_0$ | Quantizer input signal $V_{in}(t)$ | Comparison Outcome |
| --- | --- | --- | --- |
| 3 | +3 | +2.8 | Below |
| 4 | +2.5 | +2.4 | Below |

Thus, the logic processing module 406 is successfully able to track the variations of quantizer input signal $V_{in}(t)$ during the delta sigma modulator output cycle and determine a quantizer output signal q(n)=2.

Table 9 illustrates an iterative quantizer output signal determination process using tracking for one comparator 402.0 using alternating tracking threshold values. The initial quantizer input signal $V_{in}(t)$=4.2 and the final value is 2.8.

TABLE 9

| Approximation Cycle | Threshold Value - $TH_0$ | Quantizer input signal $V_{in}(t)$ | Comparison Outcome |
| --- | --- | --- | --- |
| 1 | +4 | +4.2 | Above |
| 2 | +4.5 | +3.7 | Below |
| 3 | +4 | +3.2 | Below |
| 4 | +3.5 | +2.8 | Below |

Thus, the logic processing module 406 is successfully able to track the variations of quantizer input signal $V_{in}(t)$ during the delta sigma modulator output cycle and determine a quantizer output signal q(n)=3.

With sufficiently rapid comparisons of quantizer input signal $V_{in}(t)$ to successive threshold values, successive reference generator 404 can increase the number of approximation cycles per delta sigma modulator output cycle and track any quantizer input signal $V_{in}(t)$ during each delta sigma modulator output cycle. Faster tracking can be achieved by using even levels in only the next to last comparison.

Another embodiment of the iterative quantizer output signal determination process uses multiple comparators. Multiple comparators accelerate the iterative quantizer output signal determination process. For example, in a first approximation cycle, the comparators can be set at coarse threshold levels followed by a finer threshold level in a second approximation cycle.

The tracking approach can be simplified by using two comparators 402.0 and 402.1 and respective thresholds $TH_0$ and $TH_1$ differing by only one quantization level. For example, if q(n−1)=4, thresholds $TH_0$ and $TH_1$ are set to respectively 3.5 and 4.5, i.e. the quantizer output value of the previous delta sigma modulator output cycle, q(n−1), +/−0.5. In at least one embodiment, the number of approximation cycles per delta sigma modulator output cycle is fixed to allow the successive reference generator 404 to estimate quantizer input signal $V_{in}(t)$.

Table 10 illustrates an iterative quantizer output signal determination process using tracking for two comparators 402.0 and 402.1. In the embodiment of Table 10, the number of approximation cycles is fixed to two. For two comparators and two approximation cycles, the quantizer 401 can tolerate a change of two quantization levels by quantizer input signal $V_{in}(t)$ during one delta sigma modulator output cycle.

TABLE 10

| Approximation Cycle | Threshold Value - $TH_0$ | Threshold Value - $TH_1$ | Quantizer input signal $V_{in}(t)$ | Comparison Outcome |
|---|---|---|---|---|
| 1 | +3.5 | +4.5 | +3 | Below/Below |
| 2 | +2.5 | +3.5 | +3 | Above/Below |

Figure 6:
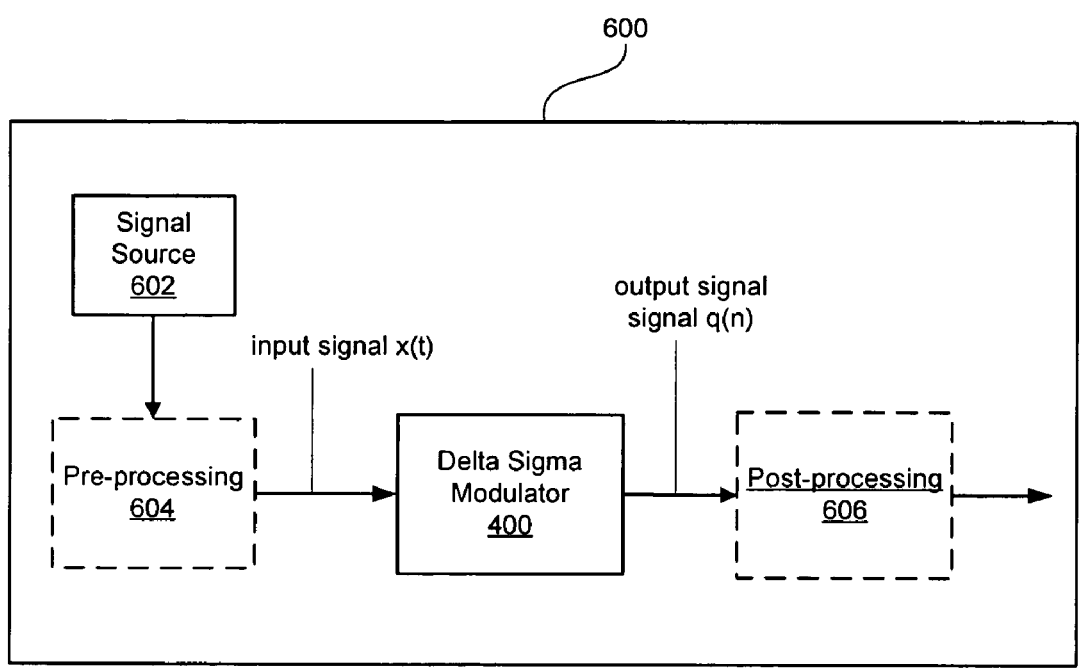
FIG. 6 depicts a signal processing system with the delta sigma modulator of FIG. 4.

FIG. 6 depicts a signal processing system 600 that includes reduced comparator delta sigma modulator 400. The signal processing system 600 is particularly useful for high-end audio applications. Signal processing system 600 processes an input signal x(t) generated by an input signal source 602. The input signal x(t) may be an audio signal, a video signal, an audio plus video signal, and/or other signal type. The input signal x(t) is, for example, an analog signal generated by a microphone. Generally, input signal x(t) undergoes some preprocessing 604 prior to being modulated by delta sigma modulator 400. Exemplary preprocessing includes low pass filtering to attenuate out-of-band signals. Signal processing system 600 also generally includes post-processing 606, such as low-pass filtering the output signals q(n). Additional post-processing can include recording of the averaged, digital output onto a recording medium or providing the averaged, digital output to a device that utilizes digital signals such as a digital audio recorder and/or player.

Although the present invention has been described in detail, it should be understood that various changes, substitutions and alterations can be made hereto without departing from the spirit and scope of the invention as defined by the appended claims.

What is claimed is:

1. A signal processing system comprising:
   an analog-to-digital delta sigma modulator, wherein the delta sigma modulator generates one quantization output signal per a delta sigma modulator output cycle, the delta sigma modulator comprising:
      a loop filter to generate a quantizer input signal;
      a quantizer, coupled to the loop filter, wherein the quantizer comprises:
         an input terminal to receive the quantizer input signal;
         a comparator, wherein the comparator makes at least two comparisons per a delta sigma modulator output cycle and is configured to receive the quantizer input signal and compare the quantizer input signal against a threshold; and
         a successive reference generator, coupled to the comparator, to determine the threshold for the comparator, wherein the threshold during a later one of the at least two comparisons is in conformity with results of an earlier one of the at least two comparisons.

2. The signal processing system of claim 1 wherein the successive reference generator determines:
   a final comparison threshold during the later one of the at least two comparisons to be at a level that is approximately half way between quantization levels; and
   a non-final comparison threshold during the earlier one of the at least two comparisons to be at a level that is approximately equal to a quantization level.

3. The signal processing system of claim 1 wherein the successive reference generator further comprises:

processing modules having logic to, within the delta sigma modulator output cycle, initially apply coarse threshold adjustments and subsequently apply finer threshold adjustments.

4. The signal processing system of claim 1 wherein the comparator is further configured to generate comparison data based on a comparison between the quantizer input signal and the threshold, and the successive reference generator further comprises:
   processing modules to process the comparison data and generate a select signal to select a value for the threshold; and
   a reference generator to receive the select signal and provide the threshold to the comparator.

5. The signal processing system of claim 4 wherein the successive reference generator comprises:
   series coupled impedances; and
   a multiplexer having multiple inputs coupled to receive respective voltage references generated across the impedances.

6. The signal processing system of claim 1 wherein the loop filter comprises a continuous time filter.

7. The signal processing system of claim 1 wherein the loop filter comprises a switched capacitor filter.

8. The signal processing system of claim 1 wherein, during the delta sigma modulator output cycle, the comparator is further configured to receive multiple thresholds that iteratively approximate the quantizer input signal and generate iterative comparison data representing iterative comparisons between the input signal and the multiple thresholds.

9. The signal processing system of claim 1 wherein each non-final threshold during the delta sigma modulator output cycle does not include a final threshold during the delta sigma modulator output cycle.

10. A method of processing a quantizer input signal with a delta sigma modulator, wherein the delta sigma modulator generates one quantization output signal per a delta sigma modulator output cycle, the method comprising:
    noise shaping an input signal to generate the quantizer input signal;
    receiving the quantizer input signal with an input terminal of a comparator;
    comparing, by the comparator that makes at least two comparisons per the delta sigma modulator output cycle, the quantizer input signal against a threshold; and
    determining, by a successive reference generator coupled to the comparator, the threshold for the comparator, wherein the threshold during a later one of the at least two comparisons is in conformity with results of an earlier one of the at least two comparisons.

11. The method of claim 10 wherein determining, by the successive reference generator, the threshold for the comparator further comprises:

determining a final comparison threshold during the later one of the at least two comparisons to be at a level that is approximately half way between quantization levels; and determining a non-final comparison threshold during the earlier one of the at least two comparisons to be at a level that is approximately equal to a quantization level.

12. The method of claim 10 wherein determining, by the successive reference generator, the threshold for the comparator further comprises:

limiting the threshold to within plus or minus a maximum expected deviation of the quantizer input signal from a value based on one or more preceding quantizer input signals.

13. The method of claim 10 wherein comparing, by the comparator, the quantizer input signal against a threshold further comprises:

within the delta sigma modulator output cycle, initially applying coarse threshold adjustments and subsequently applying finer threshold adjustments.

14. The method of claim 10 further comprising:

for the comparator, generating comparison data based on a comparison between the quantizer input signal and the threshold;

processing the comparison data to generate a select signal to select a value for the threshold;

receiving the select signal; and providing the threshold to the comparator in accordance with the select signal.

15. The method of claim 10 wherein a non-final comparison threshold during the delta sigma modulator output cycle does not include a final comparison threshold during the delta sigma modulator output cycle.

16. The method of claim 10 wherein the quantizer input signal is a continuous time signal.

17. The method of claim 10 wherein the quantizer input signal is a discrete time signal.

18. A signal processing system comprising:

an analog-to-digital delta sigma modulator comprising:

an input to receive an input signal;

a filter coupled to the input; and a quantizer coupled to the filter to quantize an output of the filter in an output cycle of operation of the delta sigma modulator, wherein the quantizer comprises:

a comparator, wherein the comparator makes at least two comparisons for the output cycle and is configured (i) to receive the input signal and (ii) to compare the input signal against a threshold; and a successive reference generator, coupled to the comparator, to determine the threshold for the comparator, wherein the threshold during a later one of the at least two comparisons is in conformity with results of an earlier one of the at least two comparisons.

19. The signal processing system of claim 18 wherein the successive reference generator further comprises:

processing modules to process comparison data and generate a select signal to select a value for each reference signal; and a reference generator to receive the select signal and provide each reference signal to the comparator.

20. The signal processing system of claim 19 wherein the reference generator further comprises:

series coupled impedances; and a multiplexer having multiple inputs coupled to receive respective voltage references generated across the impedances.

21. A method of quantizing an input signal with an analog-to-digital delta sigma modulator, the method comprising:

noise shaping the input signal to generate a quantizer input signal;

receiving the quantizer input signal during a delta sigma modulator output cycle;

receiving successive reference signals during the delta sigma modulator output cycle;

iteratively comparing the quantizer input signal with the successive reference signals during the delta sigma modulator output cycle; and generating one output for the delta sigma modulator output cycle, wherein the one output represents an estimate of the quantizer input signal derived from the iterative comparisons between the quantizer input signal and the successive reference signals.

22. The method of claim 21 wherein iteratively comparing the quantizer input signal with the successive reference signals during the delta sigma modulator output cycle further comprises:

(a) generating a comparison between the quantizer input signal and one or more first reference signals; and (b) repeating step (a) with one or more second reference signals.

23. The method of claim 22 further comprising:

receiving each comparison of the quantizer input signal and the one or more first reference signals; and generating the one or more second reference signals based on the comparison of the quantizer input signal and the one or more first reference signals to obtain a more precise estimation of the quantizer input signal than an estimation based on the comparison of the quantizer input signal and the one or more first reference signals.

24. The method of claim 21 wherein iteratively comparing the quantizer input signal with the successive reference signals during the delta sigma modulator output cycle further comprises:

within the delta sigma modulator output cycle, initially applying coarse adjustments to each reference signal and subsequently applying finer adjustments to each reference signal when a previous comparison of the quantizer input signal with one of the reference signals indicates that the quantizer input signal is within a predetermined fine adjustment threshold.

25. The method of claim 21 wherein the quantizer input signal is a continuous time signal.

26. The method of claim 21 wherein the quantizer input signal is a discrete time signal.

27. A signal processing system comprising:

an analog-to-digital delta sigma modulator, wherein the delta sigma modulator generates one quantization output signal per a delta sigma modulator output cycle, the delta sigma modulator comprising:

a loop filter to generate a quantizer input signal;

a quantizer, coupled to the loop filter, wherein the quantizer comprises:

an input terminal to receive the quantizer input signal;

at least two comparators, wherein each of the at least two comparators makes at least two comparisons per a delta sigma modulator output cycle and is configured to receive the quantizer input signal and compare the quantizer input signal against a threshold; and a successive reference generator, coupled to the at least two comparators, to determine the threshold for each of the at least two comparators, wherein the threshold during a later one of the at least two comparisons is in conformity with results of an earlier one of the at least two comparisons.

28. The signal processing system of claim 27:

wherein the at least two comparators are one comparator and another comparator, the one comparator makes one set of at least two comparisons and the another comparator makes another set of at least two comparisons;

wherein the successive reference generator determines one threshold for the one comparator and the one threshold during a later one of the one set of at least two comparisons is in conformity with results of an earlier one of the one set of at least two comparisons; and wherein the successive reference generator determines another threshold for the another comparator and the another threshold during a later one of the another set of at least two comparisons is in conformity with results of an earlier one of the another set of at least two comparisons.

* * * * *